United States Patent [19]

Hashimoto

[11] Patent Number: 4,829,478
[45] Date of Patent: May 9, 1989

[54] ROM AMPLIFIER DEVICE

[75] Inventor: Masashi Hashimoto, Kihara Miho, Japan

[73] Assignee: Texas Instruments Incorporated, Dallas, Tex.

[21] Appl. No.: 926,435

[22] Filed: Nov. 3, 1986

[51] Int. Cl.[4] .......................... H03L 5/00; H03K 3/26; G01R 19/00

[52] U.S. Cl. ..................................... 365/94; 365/226; 365/189.05; 365/230.01; 307/264; 307/270; 307/279; 307/530; 307/579

[58] Field of Search ............... 307/279, 482, 579, 270, 307/580, 264, 226; 365/189

[56] References Cited

U.S. PATENT DOCUMENTS 4,142,111  2/1979  McElroy .......................... 307/279

OTHER PUBLICATIONS

I.B.M. Tech. Disc. Bul. "Bit Driver" D. P. Repchick.

Primary Examiner—John S. Heyman
Assistant Examiner—M. R. Wambach
Attorney, Agent, or Firm—N. Rhys Merrett; Melvin Sharp; Gary Honeycutt

[57] ABSTRACT

A semiconductor integrated circuit device including a signal line connected at one point thereof to a source of a signal voltage variable between high and low levels and a source of an activating signal variable between high and low voltage levels, wherein at least one signal amplifier circuit is operatively connected to the signal line. The signal amplifier circuit is responsive to the activating signal for allowing the signal line to connect to the source of the activating signal in response to the high level of the signal voltage on the signal line in the presence of the activating signal of the high voltage level and maintaining the signal line disconnected from the source of the activating signal in response to the signal voltage of the low level on the signal line.

16 Claims, 4 Drawing Sheets

ROM AMPLIFIER DEVICE

FIELD OF THE INVENTION

The present invention relates to a semiconductor memory device and, more particularly, to a semiconductor read-only memory device implemented on a semiconductor substrate

BACKGROUND OF THE INVENTION

One of the most basic demands in the art of semiconductor integrated circuits is to realize devices which feature high speed signal transmission performance and low production cost. Sustained research and development efforts are therefore being made to realize semiconductor integrated circuits providing higher signal transmission rates achievable without involving significant penalties on the production costs.

It is accordingly a prime object of the present invention to provide a semiconductor integrated circuit device offering increased signal transmission rates through the conductor lines of the circuit with no significant increments required in the real estate on the semiconductor chip and production cost of the circuit device.

SUMMARY OF THE INVENTION

In accordance with a general aspect of the present invention, there is provided a semiconductor integrated circuit device including a signal line connected at one point thereof to a source of a signal voltage variable between first and second predetermined levels and a source of an activating signal variable between first and second predetermined voltage levels, characterized by at least one signal amplifier circuit operatively connected to the signal line and responsive to the activating signal for allowing the signal line to connect to the source of the activating signal in response to the signal voltage of the first predetermined level on the signal line in the presence of the activating signal of the first predetermined voltage level and maintaining the signal line disconnected from the source of the activating signal in response to the signal voltage of the second predetermined level on the signal line.

In accordance with a more detailed aspect of the present invention, there is provided a semiconductor integrated circuit device including a signal line connected at one point thereof to a source of a signal voltage variable between first and second levels, a source of a first predetermined voltage, a source of a second predetermined voltage, and a source of an activating signal variable between first and second predetermined voltage levels, characterized by at least one signal amplifier circuit comprising first, second and third active elements, (a) the first active element having a control terminal connected to the signal line, an input terminal connected through the second active element to the source of the first predetermined voltage and an output terminal connected through to the source of the second predetermined voltage, (b) the second active element having a control terminal connected to the source of the activating signal, an input terminal connected to the source of the first predetermined voltage and an output terminal connected to the input terminal of the first active element, and (c) the third active element having a control terminal connected to a node between the input terminal of the first active element and the output terminal of the second active element, an input terminal connected to the source of the activating signal and an output terminal connected to the signal line, (d) the first active element being operative to provide a current path between the input and output terminals thereof in response to the signal voltage of the first level applied to the signal line for allowing the node to connect to the source of the second predetermined voltage and to interrupt the current path in response to the signal voltage of the second level applied to the signal line for maintaining the node disconnected from the source of the second predetermined voltage, (e) the second active element being operative to provide a current path between the input and output terminals thereof in response to the activating signal of the second level for connecting the node to the source of the first predetermined voltage and to interrupt the current path through the second active element in response to the activating signal of the first level for maintaining the node disconnected from the source of the first predetermined voltage, (f) the third active element being operative to provide a current path between the input and output terminals thereof in the absence of the first predetermined voltage at the node for allowing the signal line to connect to the source of the activating signal and to interrupt the current path through the third active element for maintaining the signal line disconnected from the source of the activating signal.

BRIEF DESCRIPTION OF THE DRAWINGS

The drawbacks of a prior-art semiconductor integrated circuit device and the features and advantages of a device according to the present invention will be more clearly understood from the following description taken in conjunction with the accompanying drawings in which like reference numerals designate similar or corresponding units and elements and in which.

DESCRIPTION OF THE PRIOR ART

Figure 1:
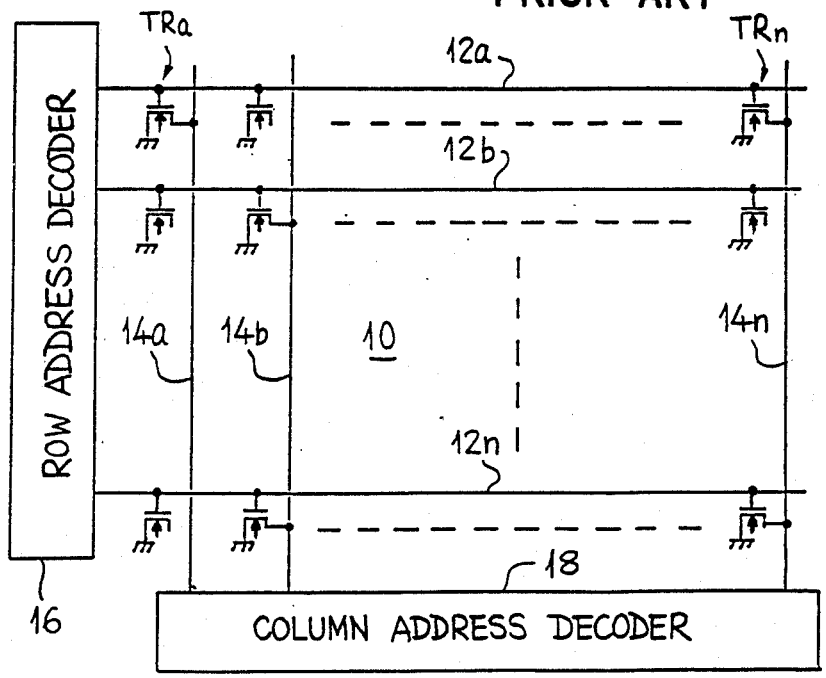
FIG. 1 is a schematic circuit diagram showing the circuit arrangement of a known semiconductor read-only memory device.

Referring to FIG. 1, a known semiconductor read-only memory device is shown including a memory cell array 10 of matrix form having a plurality of row or word lines 12a, 12b, ... 12n and a plurality of column or bit lines 14a, 14b, ... 14n. A number of memory cells are located at the individual intersections of these word lines 12a, 12b, ... 12n /and bit lines 14a, 14b, ... 14n. The memory device herein shown is assumed to be of the mask type with each of the memory cells implemented by an n-channel MOS (metal-oxide-semiconductor) field-effect transistor having its gate connected to a row line and its source connected to ground line. They memory cells forming the memory cell array 10 are thus broken down to two major categories, one consisting of memory cells memorizing logic "0" bits of information and the other consisting of memory cells memorizing logic "1" bits of information. Each of the memory cells memorizing logic "0" bits of information is shown having its drain connected to a bit line and each of the memory cells memorizing logic "1" bits of information is shown having its drain floating. The word lines 12a, 12b, ... 12n are connected to output terminals of a row address decoder 16 and, likewise, the bit lines 14a, 14b, ... 14n are further connected to output terminals of a column address decoder 18.

Figure 2:
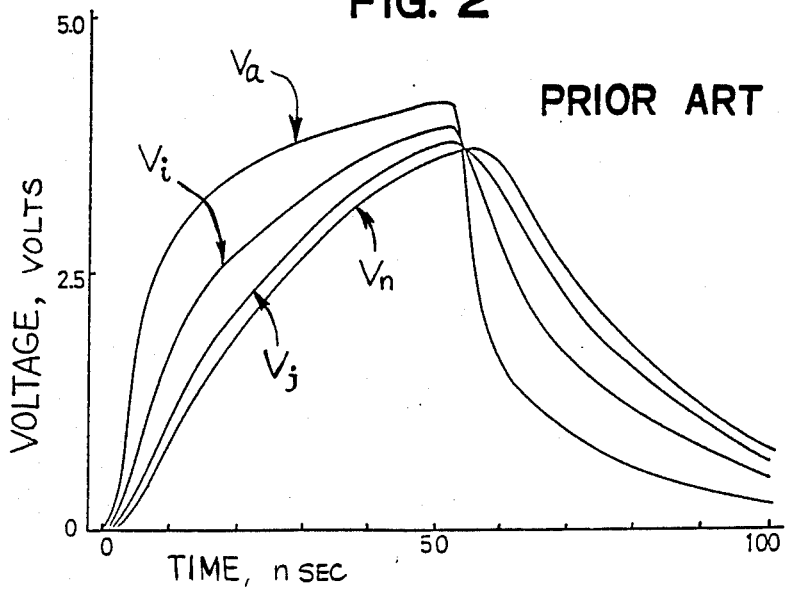
FIG. 2 is a graphic representation of the waveforms of some voltages which may appear in the memory device shown in FIG. 1 during active mode of operation of the device.

FIG. 2 shows waveforms indicating the variation, in terms of time in nanoseconds, in the voltages at some points of the word line 12a after a row address signal is applied to the word line in the read-only memory array 10 of the nature hereinbefore described. In FIG. 2, curves $V_a$ and $V_n$ show the variation in the voltages at the gates of the cell transistors (represented by $TR_a$ and $TR_n$) at the intersections between the word line 12a and bit lines 14a and 14n, respectively, viz., of the cell transistors closest and most remote from the row address decoder 16. Curves $V_i$ and $V_j$ show the variation in the voltages at the gates of the cell transistors at the intersections between the word line 12a and any two of the bit lines located between the bit lines 14a and 14n. As will be seen from these curves $V_a$, $V_i$, $V_j$ and $V_n$, the voltage on the word line 12a rises and falls at rates which are lower at points farther from the row address decoder 16 and the transmission of the signal on the line 12a is retarded increasingly as the signal advances away from the row address decoder 16. The length of the word lines is a direct reflection of the capacity of a memory array and, for this reason, the larger the memory capacity, the more serious the delay in the transmission of signals on the word lines of the memory array will be.

To lessen such delay in the transmission of signals on the word lines of a semiconductor memory device is one of the important requirements of the device. As well known in the art, however, the transmission rates of signals in a semiconductor integrated circuit device are restricted by the mathematical product of the supplied electric power and the speed of transmission through a line. It is for this reason required to use an increased power supply in order to achieve an increased transmission rate of a signal in a semiconductor integrated circuit device. The use of an increased power supply however results in an increase in the sizes of the driving transistors included in the integrated circuit and accordingly in increases in the size and production cost of the chip forming the circuit.

One approach to reducing the signal transmission rates of a semiconductor memory device is to split each of the word lines into, for example, eight segments and to have each of these segments controlled by the use of a decoder. A semiconductor chip using such a memory device however needs the provision of two interconnect layers for the word lines and thus requires intricate chip configuration and process steps which make it difficult to scale down the chip configuration.

The goal of the present invention is to provide a semiconductor integrated circuit device adapted to achieve increased signal transmission rates with no significant increments required in the real estate and production cost of the circuit device, for thereby providing a simple and useful solution to these problems which have thus far been inherent in semiconductor integrated circuit devices such as typically semiconductor memory devices.

DESCRIPTION OF THE PREFERRED EMBODIMENTS

Figure 3:
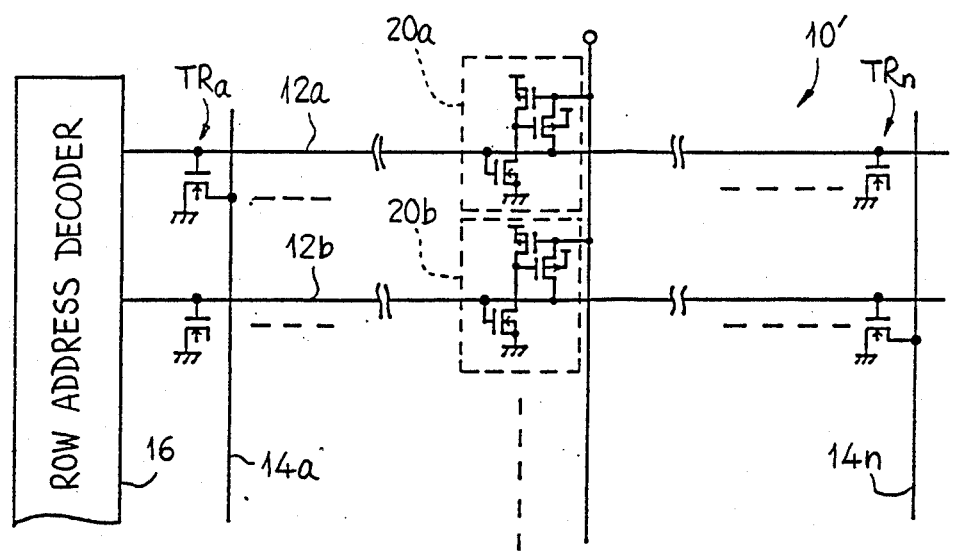
FIG. 3 is a diagram similar to FIG. 1 but shows the circuit arrangement of a preferred embodiment of a semiconductor integrated circuit device according to the present invention.

In the description to follow, a semiconductor integrated circuit device according to the present invention will be described as being embodied in a read-only memory device of the mask type. In FIG. 3, such a memory device is shown basically similar in construction to the device described with reference to FIG. 1 and is thus assumed to include a memory cell array 10' having word lines 12a, 12b, ... and bit lines 14a to 14n. Memory cells are located at the intersections of these word lines 12a, 12b, ... and bit lines 14a to 14n. Each of these memory cells is also assumed to be implemented by an n-channel MOS field-effect transistor having its gate connected to a row line and its source connected to ground line. As in the arrangement shown in FIG. 1, each of the memory cells memorizing logic "0" bits of information is shown having its drain connected to a bit line and each of the memory cells memorizing logic "1" bits of information is shown having its drain floating. As is customary in the art, each of the word lines 12a, 12b, ... and bit lines 14a to 14n is connected through the source/drain current path of a precharge transistor to ground line, though not shown in the drawings.

The word lines 12a, 12b, ... are further connected to output terminals of a row address decoder 16 and, likewise, the bit lines 14a to 14n are further connected to output terminals of a column address decoder 18. Each of these row and column address decoders 16 and 18 has input terminals connected to row and column address input lines though not shown in the drawings. The row and column address decoders 16 and 18 further have input terminals connected to a timing control circuit and are responsive to control pulses supplied therefrom to decode the address signals which appear at the address input lines. Furthermore, the column address decoder 18 has output terminals ordinarily connected through sensing and output buffer circuits to a data output line, though not shown.

In the shown embodiment of a semiconductor integrated circuit device according to the present invention, there are provided a plurality of signal amplifier circuits 20a, 20b, ... in association with the individual word lines 12a, 12b, ... respectively. These signal amplifier circuits 20a, 20b, ... are all similar in configuration and are thus represented in FIG. 4 by a signal amplifier circuit 20 provided in association with a word line 12.

Figure 4:
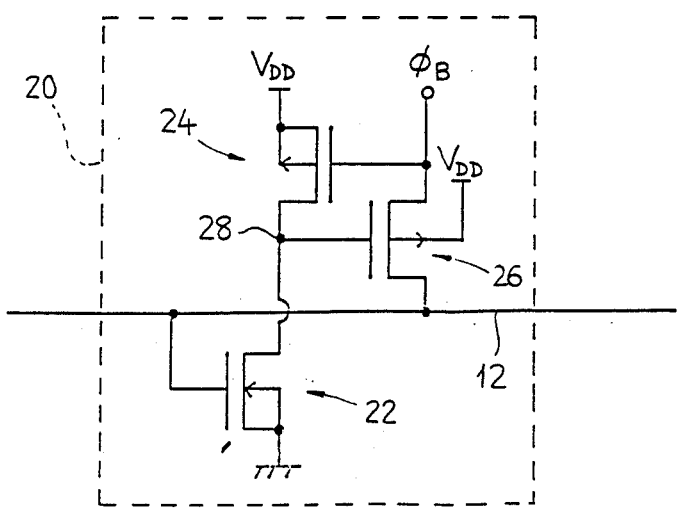
FIG. 4 is a circuit diagram showing a preferred example the circuit arrangement of each of the amplifier circuits provided in the embodiment shown in FIG. 3.

As shown in FIG. 4, the signal amplifier circuit 20 comprises an n-channel MOS field-effect transistor 22 serving as a switching transistor, a p-channel MOS field-effect transistor 24 serving as a driver transistor, and a p-channel MOS field-effect transistor 26 serving as an amplifier transistor. The n-channel switching transistor 22 has its gate connected to the word line 12 and its source connected to ground line. The p-channel driver transistor 24 has its gate connected to a source of an activating signal $\phi_B$, its source connected to a source of a supply voltage $V_{DD}$, and its drain connected to the drain of the switching transistor 22. The p-channel amplifier transistor 26 has its gate connected to a node 28 between the drains of the switching and driver transistors 22 and 24, its source connected to the source of the activating signal $\phi_B$, and its drain connected to the word line 12. Furthermore, the p-channel amplifier transistor 26 of the signal amplifier circuit 20 in the signal amplifier circuit 20 herein shown has its n-type substrate portion electrically connected to the source of the supply voltage $V_{DD}$ as shown.

During or prior to each read cycle of operation of the memory device, each of the word lines 12a, 12b, . . . shown in FIG. 3, viz., the word line 12 shown in FIG. 4 is precharged to ground level through the precharge transistor (not shown) connected to the word line. The switching transistor 22 is thus turned off with a potential of the ground level established at the gate thereof. Throughout this precharge mode of operation, the activating signal $\phi_B$ is maintained at a low or ground level so that the charge transistor 24 is turned on and establishes a potential approximating the supply voltage $V_{DD}$ at the node 28 among the three transistors 22, 24 and 26. With the potential approximating the supply voltage $V_{DD}$ thus established at the node 28, the amplifier transistor 26 is turned off and decouples the address line 12 from the source of the activating signal/$B_{phi}$ B).

When the activating signal $\phi_B$ then shifts to a high level approximating the supply voltage $V_{DD}$, the p-channel charge transistor 24 is turned off. The potential on the word line 12 being maintained at low level, the switching transistor 22 is held in a non-conduction state so that the potential at the node 28 floats at the level approximating the supply voltage $V_{DD}$. The amplifier transistor 26 is also maintained in a non-conduction state with the potential of a high level established at the gate thereof.

If the word line 12 is not selected during the current read cycle of the device, the potential on the word line is maintained at low level throughout the read cycle so that the amplifier transistor 26 is maintained in the non-conduction state throughout the read cycle. If the word line 12 is selected and a row address signal is applied to the word line 12 during the current read cycle, the potential on the word line 12 swings toward a high level approximating the supply voltage $V_{DD}$.

Figure 5:
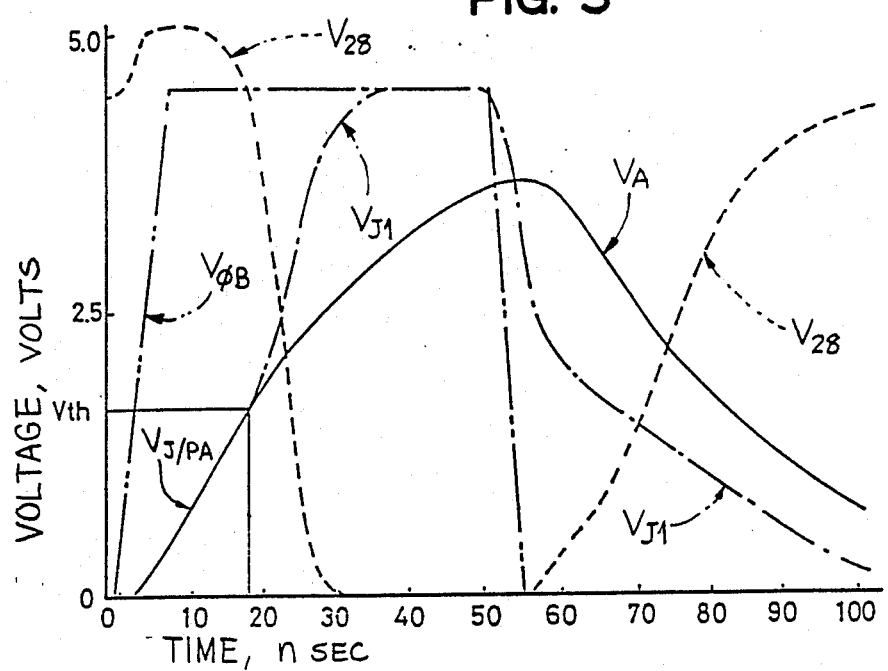
FIG. 5 is a graphic representation of the waveforms of some voltages which may appear in the integrated circuit device shown in FIG. 4 during active mode of operation of the device shown in FIG. 3.

In FIG. 5, curve $V_A$ shows the variation in the voltage at a certain point on the word line 12 as, for example, at the gate of the cell transistor TR$a$ closest on the word line 12a to the row address decoder 16 (FIG. 3) and curve $V_{J1}$ indicates the variation in the voltage at the gate of a cell transistor located on the word line 12 at a certain distance from the row address decoder 16. Curve $V_{28}$ shows the variation in the voltage at the node 28 in the signal amplifier circuit 20 shown in FIG. 4 and curve $V_{\phi B}$ shows the variation in the voltage of the activating signal $\phi_B$ supplied to the amplifier circuit 20. The variation in the potential on the word line 12 at an incipient stage of the read cycle is indicated by common sections $V_{J/PA}$ of the curves $V_A$ and $V_{J1}$.

The potential on the word line 12 rises gradually toward the high level approximating the supply voltage $V_{DD}$ as indicated by the common sections $V_{J/PA}$ of the curves $V_A$ and $V_{J1}$ and will reach the threshold level $V_{TH}$ of the switching transistor 22 at a certain point of time (about 18 nsec) after the row address signal has been supplied from the row address decoder 16 (FIG. 3). When the potential on the word line 12 thus reaches the threshold level $V_{TH}$ of the n-channel switching transistor 22, the transistor 22 is turned on to provide a current path through the drain and source of the transistor. It therefore follows that the charges which have been accumulated at the node 28 are allowed to pass through the switching transistor 22 to ground line so that the potential at the node 28 falls from the level approximating the supply voltage $V_{DD}$ suddenly to the ground level as will be seen from curve $V_{28}$ in FIG. 5. A potential of a low level being now built up at the node 28, the p-channel amplifier transistor 26 is turned on to provide a current path through the source and drain of the transistor 26. The activating signal $\phi_B$ of high level is thus allowed to pass through the transistor 26 to the word line 12 and raises the potential on the word line 12 rapidly to a level approximating the supply voltage $V_{DD}$ as will be seen from curve $V_{J1}$ in FIG. 5. Thus, the potential at the gate of the cell transistor located at a certain distance from the row address decoder 16 swings to the level approximating the supply voltage $V_{DD}$ immediately after the potential on the word line 12 has reached the threshold level $V_{TH}$ of the switching transistor 22. In other words, the potential at the gate of the particular cell transistor reaches a sufficiently high level far more rapidly than the potential in the vicinity of the cell transistor TR$_a$ closest to the row address decoder 16 (FIG. 3) does, as will be readily seen from comparison between curves $V_A$ and $V_{J1}$ of FIG. 5.

Simultaneously as the potential on the word line 12 then begins to fall, the activating signal $\phi_B$ also falls toward a low level and activates the p-channel charge transistor 24 to turn on when the signal $\phi_B$ reaches the ground level. The discharge transistor 24 being thus turned on, the potential at the node 28 begins to rise toward the supply voltage $V_{DD}$ through the charge transistor 24. The on-state resistance of the discharge transistor 24 is selected at a relatively large value so that the potential at the node 28 rises at a controlled, relatively low rate as will be seen from curve $V_{28}$ in FIG. 5. This allows the amplifier transistor 26 to stay in the conduction state for some time after the charge transistor 24 has initially been turned on. The result is that the potential on the word line 12 is pulled toward the level of the activating signal $\phi_B$ of ground level and is for this reason reduced to low level at a relatively high rate after the signal $\phi_B$ has fallen to the ground level as will be seen from curve $V_{J1}$ in FIG. 5.

As will be understood from the foregoing description, particularly from the curve $V_{J1}$ of FIG. 5, the voltage on a word line rises and falls at rates significantly higher in the memory array 10' than in the memory array 10 of the prior-art device described with reference to FIG. 1. Once a word line is selected and is energized by a row address signal, the selected memory location can therefore be accessed and the information stored at the memory location read out within a far shorter period of time than that required in the prior-art memory device of FIG. 1. Thus, the memory device embodying the present invention is adapted to achieve a faster readout rate and a shorter access time than a known memory device of the described nature. It may also be mentioned that each of the signal amplifier circuits 20a, 20b, . . . provided in accordance with the present invention can be sized to be easily formed between the word lines designed with a sufficient degree of tolerance for the accommodation of memory cells on a semiconductor chip. Provision of such amplifier circuits on a semiconductor chip will therefore require substantially no additional real estate on the chip in realizing the present invention. It may further be noted that the signal amplifier circuits 20a, 20b, . . . provided in accordance with the present invention can be per se fabricated with ease and at a low cost on a standard semiconductor substrate.

Figure 6:
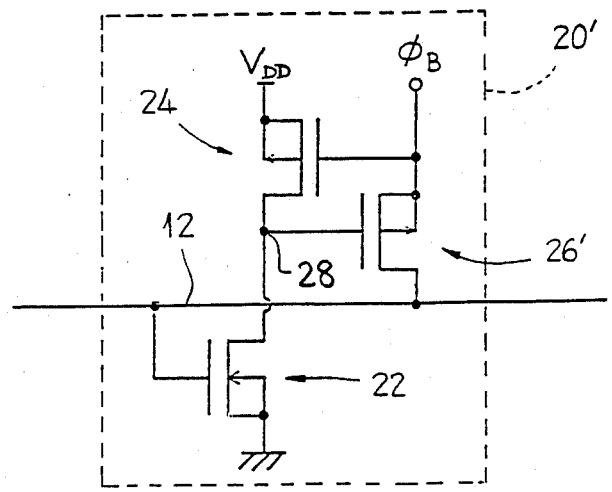
FIG. 6 is a circuit diagram showing another preferred example the circuit arrangement of each of the amplifier circuits provided in the embodiment shown in FIG. 3.

Another advantage achievable through the provision of the signal amplifier circuits 20a, 20b, . . . as described is that the precharge of the bit lines 14a to 14n of the memory array 10' can be effected at an early point of time during each read cycle of the device because of the reduced fall time of the signal on the selected word line. This will contribute to reduction of the period of time for the precharge of the bit lines of the memory device. The signal amplifier circuit 20 described with reference to FIG. 4 may be modified with a view to enhancing such an advantage of a semiconductor integrated circuit device according to the present invention. FIG. 6 shows an example of such a modification of the signal amplifier circuit 20 shown in FIG. 4.

Figure 7:
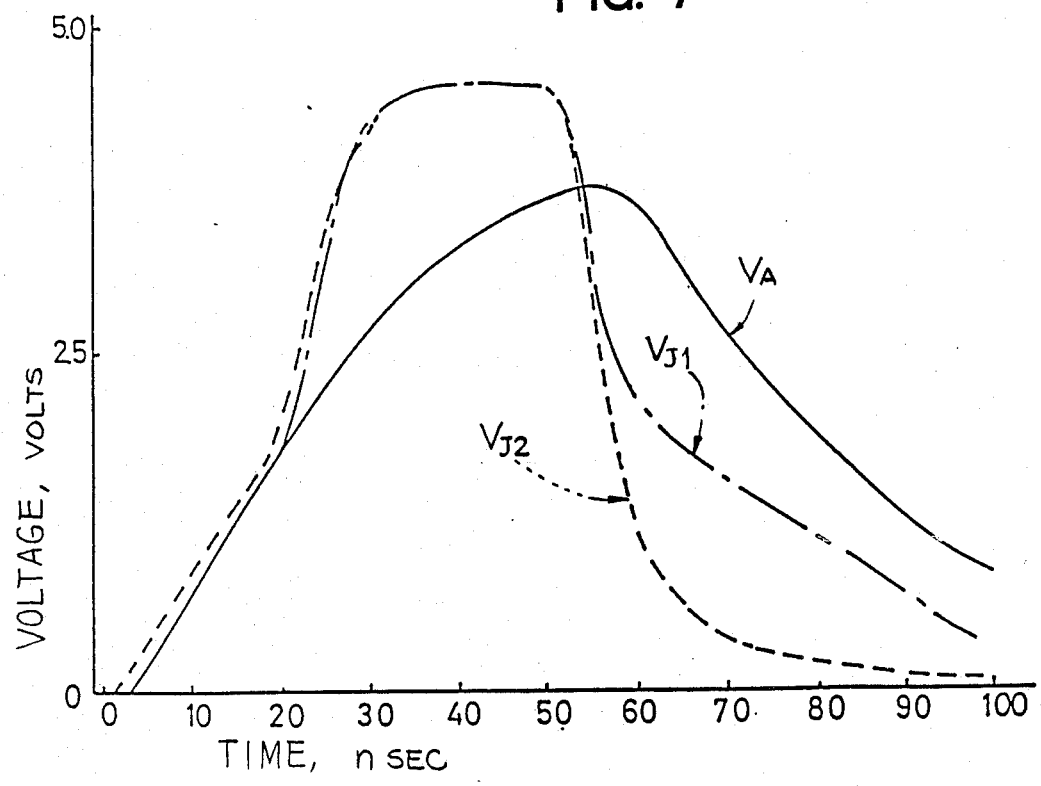
FIG. 7 is a graphic representation of the waveforms of some voltages which may appear in the integrated circuit device shown in FIG. 6 during active mode of operation of the device shown in FIG. 3.

In the modified amplifier circuit herein shown, the p-channel amplifier transistor 26 of the signal amplifier circuit, now represented by 20', has its substrate portion connected to the source of the activating signal $\phi_B$, in contrast to the transistor 26 of the signal amplifier circuit 20 of FIG. 4 which has its substrate portion connected to the source of the supply voltage $V_{DD}$. FIG. 7 shows the variation in the voltage at two different points on the word line 12. Curve $V_A$ is similar to its counterpart in FIG. 5, while curve $V_{J2}$ corresponds to the curve $V_{J1}$ for the amplifier circuit 20 of FIG. 5 and thus indicates the variation in the voltage at the gate of a cell transistor located on the word line 12 at a certain distance from the row address decoder 16 (FIG. 3). As will be seen from curves $V_{J1}$ and $V_{J2}$, the signal amplifier circuit 20' of FIG. 6 operates similarly to the amplifier circuit 20 of FIG. 4 insofar as the voltage on the word line 12 is rising toward the supply voltage $V_{DD}$.

When the voltage of the activating signal $\phi_B$ begins to fall with a concurrent fall in the potential on the word line 12, the p-channel charge transistor 24 is activated to turn on so that the potential at the node 28 begins to rise toward the supply voltage $V_{DD}$ through the transistor 24. In response to the fall of the activating signal $\phi_B$, furthermore, the potential at the source and substrate portion of the amplifier transistor 26 swings to a low level. With a high potential present at the node 28, the p-n junction between the drain and substrate portion of the amplifier transistor 26 is biased in a forward direction so that a current flows across the p-n junction rather than through the channel region of the transistor 26. The potential at the drain and accordingly on the word line 12 is for this reason reduced to the level of the activating signal $\phi_B$, viz., the ground level more rapidly than in the embodiment using the amplifier circuit of FIG. 4 as will be seen from comparison between the curves $V_{J1}$ and $V_{J2}$ of FIG. 7.

Although only two preferred embodiments of a semiconductor integrated circuit device according to the present invention have thus far been described and shown, it should be borne in mind that such embodiments are merely for illustrative purposes and may thus be modified in numerous manners if desired. For example, the signal amplifier circuit which has been assumed to be located between the cell transistors closest to and farthest from the row address decoder may be located upstream of the cell transistor closest to the row address decoder. While, furthermore, it has been assumed that only one signal amplifier circuit is provided for each of the word lines, two or more of such an amplifier circuit may be provided in association with each word line and located as desired along the word line Furthermore, each of the n-channel switching transistor 22 and p-channel charge and amplifier transistors 24 and 26 may be substituted by a MOS field-effect transistor of the opposite conductivity type. In this instance, each of the word lines of the memory array shown in FIG. 3 should be precharged to a high level approximating the supply voltage $V_{DD}$ and the activating signal $\phi_B$ should be at a high level during precharge mode and at a low level during active mode of operation of the device. An embodiment of this nature may be implemented by a dynamic random-access memory (RAM) device using a level higher than the supply voltage $V_{DD}$ on the word lines. In such an embodiment, there may be provided suitable clock-operated voltage stepup means to step up the supply voltage $V_{DD}$ for use on the word lines and the signal $\phi_B$ for use in the amplifier circuits. While, furthermore, it has been assumed that the amplifier circuits in each of the described embodiments are provided in association with the word lines of a memory array, such networks of an integrated circuit device according to the present invention may be arranged in association with the bit lines of the array. It should be remembered that a semiconductor integrated circuit device according to the present invention may be implemented not only by a mask ROM or dynamic RAM device but by any of other types of semiconductor memory devices such as an erasable and programmable ROM (EPROM) and an electrically erasable and programmable ROM (EEPROM) or other types of semiconductor integrated circuit devices such as, for example, microprocessors and microcomputers.

What is claimed is:

1. A semiconductor integrated circuit device including a signal line connected to a source of signal voltage having first and second levels; a source of a first predetermined voltage; a source of a second predetermined voltage; and a source of an activating signal having first and second predetermined voltage levels; and at least one signal amplifier circuit comprising first, second and third active elements:

(a) the first active element having a control terminal connected to said signal line, an input terminal connected by said second active element to the source of said first predetermined voltage and an output terminal connected to the source of said second predetermined voltage, (b) the second active element having a control terminal connected to the source of said activating signal, an input terminal connected to the source of the said first predetermined voltage and an output terminal connected to the input terminal of said first active element, and (c) the third active element having a control terminal connected to a node common to the input terminal of said first active element and the output terminal of said second active element, an input terminal connected to the source of said activating signal and an output terminal connected to said signal line, (d) said first active element being operative (i) to provide a current path between the input and output terminals thereof in response to the signal voltage of the first level applied to said signal line for allowing said node to connect to the source of said second predetermined voltage and (ii) to interrupt said current path in response to the signal voltage of the second level applied to said signal line for maintaining said node disconnected from the source of said second predetermined voltage, (e) said second active element being operative (i) to provide a current path between the input and output terminals thereof in response to said activating signal of the second level for connecting said node to the source of said first predetermined voltage and (ii) to interrupt the current path through the second active element in response to the activating signal of the first level for maintaining said node disconnected from the source of said predetermined voltage, (f) said third active element being operative (i) to provide a current path between the input and output terminals thereof in the absence of said first predetermined voltage at said node for allowing said signal line to connect to said source of the activating signal and (ii) to interrupt the current path through the third active element for maintaining the signal line disconnected from said source of the activating signal.

2. A semiconductor integrated circuit device as set forth in claim 1, in which each of said first, second and third active elements comprises of a field-effct transistor, said first active element being of one conductivity channel type and having a gate, a drain and a source respectively forming the control terminal, input terminal and output terminal thereof, each of said second and third active elements being of the opposite conductivity channel type and having a gate, a source and a drain respectively forming the control terminal, input terminal and output terminal thereof.

3. A semiconductor integrated circuit device as set forth in claim 2, in which the field-effect transistor forming said third active element has a semiconductor substrate portion electrically connected to the source of said first predetermined voltage.

4. A semiconductor integrated circuit device as set forth in claim 2, in which the field-effect transistor forming said third active element has a semiconductor substrate portion electrically connected to the source of said activating signal.

5. An integrated circuit memory device implemented on a semiconductor substrate, comprising, a plurality of first address lines, a plurality of second address lines, memory cells respectively connected to a first address line and to a second address line; means for selectively applying to said first address lines a signal voltage having first and second voltage levels; an activating signal source having first and second predetermined voltage levels; and a plurality of signal amplifiers separate from said memory cells each connected to an individual one of said first address lines and to said activating signal source to couple the activating signal source to said individual address line and to the memory cells connected to said individual address line when the signal voltage applied to said individual address lines has the first predetermined voltage level and the voltage of the activating signal source has the first predetermined voltage level, and to decouple said individual address line from the activating signal source when the signal voltage level applied to that address line has the second predetermined level.

6. A memory device according to claim 5, wherein the first address line are word address lines.

7. A memory device according to claim 5, wherein the memory cells are read only memory cells.

8. A memory device according to claim 5, wherein each memory cell is a single transistor cell.

9. A memory device according to claim 8, further including memory cells connected to said first address lines but not to said second address lines.

10. An integrated circuit memory device implemented on a semiconductor substrate, comprising a plurality of word lines each connected to a plurality of memory cells, a plurality of bit lines, and at least some of said memory cells also connected to individual bit lines; means for selectively applying to said word lines a signal voltage having first or second voltage levels; an activating signal source having first and second predetermined voltage levels; and a plurality of signal amplifiers each connected to an individual lines and to said activating signal source, wherein each signal one of said word amplifier includes: (a) a first transistor having a activating signal source, and a control terminal, and (b) a second transistor having a control terminal connected to the individual word line, and a conduction path connected between the control terminal of the first transistor and a voltage supply source; and circuitry connected to the first and second transistors to apply a turn on signal to the control terminal of the first transistor to couple the activating source to the word line when the activating signal source has said first predetermined voltage level and the word line voltage has said first predetermined level but not when the word line voltage has said second predetermined level.

11. A memory device according to claim 10, wherein said circuitry includes a third transistor having a conduction path connected between the conduction path of the second transistor and a turn-on voltage supply source, and a control terminal connected to said activating signal source.

12. A memory device according to claim 11, wherein the said transistors are field effect transistors, the first and third transistors having one channel conductivity type and the second transistor having an opposite channel conductivity type.

13. A memory device according to claim 10, wherein the memory cells comprise single field effect transistor cells and the said signal amplifiers comprise field effect transistor amplifiers.

14. A memory device according to claim 13, wherein the memory cells are read only memory cells.

15. A memory device according to claim 12, wherein the second and third transistors include a semiconductor substrate regions connected to a bias voltage supply source.

16. A memory device according to claim 12, wherein the second transistor has a semiconductor region connected to said turn-on voltage supply source and said third transistor has a semiconductor region connected to said voltage supply source.

* * * * *